US012744191B2

(12) United States Patent
Han et al.

(10) Patent No.: US 12,744,191 B2
(45) Date of Patent: Sep. 22, 2026

(54) HIGH PRECISION EDGE RING CENTERING FOR SUBSTRATE PROCESSING SYSTEMS

(71) Applicant: LAM RESEARCH CORPORATION, Fremont, CA (US)

(72) Inventors: Hui Ling Han, Alameda, CA (US); Seetharaman Ramachandran, San Jose, CA (US); Marc Estoque, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1020 days.

(21) Appl. No.: 17/912,990

(22) PCT Filed: Mar. 23, 2020

(86) PCT No.: PCT/US2020/024326

§ 371 (c)(1),
(2) Date: Sep. 20, 2022

(87) PCT Pub. No.: WO2021/194468

PCT Pub. Date: Sep. 30, 2021

(65) Prior Publication Data

US 2023/0369025 A1 Nov. 16, 2023

(51) Int. Cl.
*H01J 37/32* (2006.01)
*H10P 72/50* (2026.01)

(52) U.S. Cl.
CPC ........ *H01J 37/32642* (2013.01); *H10P 72/53* (2026.01); *H01J 2237/024* (2013.01); *H01J 2237/24578* (2013.01)

(58) Field of Classification Search
CPC .......... H01J 37/32642; H01J 2237/024; H01J 2237/24578; H01L 21/681;
(Continued)

(56) References Cited

U.S. PATENT DOCUMENTS 6,521,292 B1 * 2/2003 Yudovsky ............ C23C 16/455 118/500
9,196,518 B1 11/2015 Hofmeister et al.
(Continued)

FOREIGN PATENT DOCUMENTS

JP 2007200965 A 8/2007
JP 2018010992 A 1/2018
(Continued)

OTHER PUBLICATIONS

Office Action issued in Corresponding Taiwanese Patent App. No. 109109981 mailed Apr. 28, 2024.
(Continued)

*Primary Examiner* — Hwa Andrew Lee

(57) ABSTRACT

An edge ring centering system for a plasma processing system includes a processing chamber including a substrate support and R edge ring lift pins, where R is an integer greater than or equal to 3. An edge ring includes P grooves located on a bottom surface thereof, where P is an integer greater than or equal to R. A robot arm includes an end effector. A controller is configured to cause the optical sensor to sense a first position of the edge ring on the end effector; cause the robot arm to deliver the edge ring to a first center location on the edge ring lift pins; retrieve the edge ring from the edge ring lift pins; and cause the optical sensor to sense a second position of the edge ring on the end effector.

19 Claims, 4 Drawing Sheets

(58) Field of Classification Search
CPC ......... H01L 21/67259; H01L 21/67748; H01L 21/68735; H01L 21/68742
See application file for complete search history.

(56) References Cited

U.S. PATENT DOCUMENTS

| | | | |
|---|---|---|---|
| 10,541,168 B2 | 1/2020 | Tan et al. | |
| 10,665,490 B2 | 5/2020 | Lee et al. | |
| 2018/0138069 A1* | 5/2018 | Tan | H01L 21/67248 |
| 2019/0122870 A1 | 4/2019 | Ishizawa | |
| 2020/0395195 A1* | 12/2020 | Sanchez | H01L 21/67069 |
| 2022/0254666 A1* | 8/2022 | Sadeghi | H10P 72/0606 |

FOREIGN PATENT DOCUMENTS

| | | | |
|---|---|---|---|
| JP | 2019149423 | A | 9/2019 |
| KR | 1020200004684 | A | 1/2020 |
| TW | 201834128 | A | 9/2018 |
| TW | 202009972 | A | 3/2020 |
| WO | WO-2007126016 | A1 | 11/2007 |
| WO | WO-2020036613 | A1 | 2/2020 |

OTHER PUBLICATIONS

Allowance issued in Corresponding Japanese Patent App. No. 2022-557694 mailed Nov. 26, 2024.

International Search Report and Written Opinion of the ISA issued in PCT/US2020/024326, mailed Dec. 21, 2020; ISA/KR.

* cited by examiner 100
140
130
132-1
132-2
132-N
Gas Source
Gas Source
Gas Source
134-1
134-N
Valve
Valve
Valve
136-1
136-N
MFC
MFC
MFC
120
122
124
RF Generator
Matching and Distribution Network
102
104
106
108
109
110
112
114
116
144
176
180
142
Temp Controller
146
Coolant Assembly
150
Valve
152
Pump
160
System Controller
172
Load Lock
170
Robot
182
Optical Sensor

HIGH PRECISION EDGE RING CENTERING FOR SUBSTRATE PROCESSING SYSTEMS

CROSS-REFERENCE TO RELATED APPLICATIONS

This application is a U.S. National Phase Application under 35 U.S.C. 371 of International Application No. PCT/US2020/024326, filed on Mar. 23, 2020. The entire disclosure of the application referenced above is incorporated herein by reference.

FIELD

The present disclosure relates to edge ring centering for substrate processing systems and more particularly to high precision centering of removable edge rings for plasma processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a substrate. For example, the substrate may be electrostatically clamped to the ceramic layer during processing. The substrate support may include an edge ring arranged around an outer portion (e.g., outside of and/or adjacent to a perimeter) of the substrate support. The edge ring may be provided to confine and/or shape plasma located above the substrate and to improve etch uniformity.

SUMMARY

An edge ring centering system for a plasma processing system includes a processing chamber including a substrate support and R edge ring lift pins, where R is an integer greater than or equal to 3. An edge ring includes P grooves located on a bottom surface thereof, where P is an integer greater than or equal to R. A robot arm includes an end effector. A controller is configured to cause the optical sensor to sense a first position of the edge ring on the end effector; cause the robot arm to deliver the edge ring to a first center location on the edge ring lift pins; retrieve the edge ring from the edge ring lift pins; and cause the optical sensor to sense a second position of the edge ring on the end effector.

In other features, the controller is further configured to generate a first offset based on a difference between the second position and the first position. The controller is further configured to generate a first adjusted center location for the edge ring based on the first center location and the first offset.

In other features, the controller is further configured to cause the robot arm to deliver the edge ring onto the edge ring lift pins based on the first adjusted center location; retrieve the edge ring from the edge ring lift pins; and cause the optical sensor to sense a third position of the edge ring on the robot arm.

In other features, the controller is further configured to generate a second offset based on a difference between the third position and the second position. The controller is further configured to generate a second adjusted center location based on the first adjusted center location and the second offset.

In other features, the controller is further configured to cause the robot arm to deliver the edge ring onto the edge ring lift pins based on the second adjusted center location; retrieve the edge ring from the edge ring lift pins; and cause the optical sensor to sense a fourth position of the edge ring on the robot arm. The controller is further configured to generate a third offset based on a difference between the fourth position and the third position. The controller is further configured to compare the third offset to a predetermined offset.

In other features, the controller is further configured to determine whether the edge ring is centered based on the comparison. The P grooves are "V"-shaped. The P grooves are spaced 360°/P around the bottom surface of the edge ring. The P grooves are "V"-shaped. A bottommost portion of the P grooves extend in a radial direction.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

In some substrate systems, an edge ring may be used to shape the plasma and to increase etch uniformity. As the edge ring erodes, a height of the edge ring may be adjusted by edge ring lift pins to maintain etch uniformity despite the erosion. After processing a plurality of substrates, the edge ring is sufficiently worn by the plasma and needs to be replaced.

Some substrate processing systems can replace the edge ring without breaking vacuum using a robot arm that is normally used to deliver and remove substrates from the processing chamber. Systems and methods according to the present disclosure may be used for precisely centering the edge ring relative to the substrate support.

Figure 1:
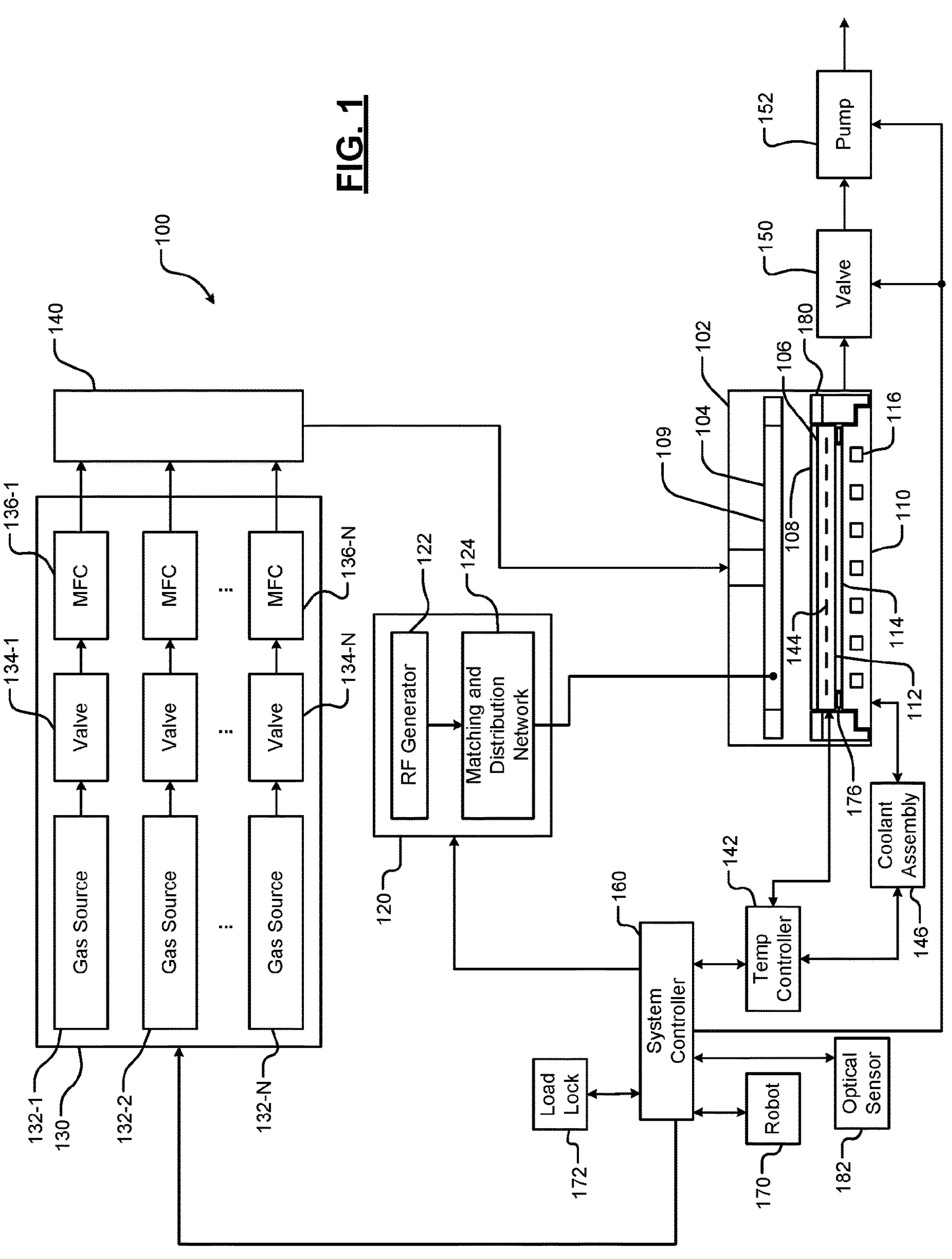
FIG. 1 is a functional block diagram of an example of a plasma processing system according to the present disclosure.

Referring now to FIG. 1, an example substrate processing system 100 is shown. For example only, the substrate processing system 100 may be used for performing etching using RF plasma and/or other types of substrate processing. The substrate processing system 100 includes a processing chamber 102 that encloses other components of the substrate processing system 100 and contains the RF plasma. The processing chamber 102 includes an upper electrode 104 and a substrate support 106, such as an electrostatic chuck (ESC). During operation, a substrate 108 is arranged on the substrate support 106. While a specific substrate processing system 100 and processing chamber 102 are shown as an example, the principles of the present disclosure may be applied to other types of substrate processing systems and chambers using the edge rings, such as a substrate processing system that uses remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a baseplate 110 that is conductive and acts as a lower electrode. The baseplate 110 supports a ceramic layer 112. In some examples, the ceramic layer 112 may incorporate resistive heaters, RF electrodes, and/or electrostatic electrodes (all not shown). A bond layer 114 may be arranged between the ceramic layer 112 and the baseplate 110 and may act as a thermal resistance layer. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. Although the RF generating system 120 corresponds to a capacitively coupled plasma (CCP) system, the principles of the present disclosure may also be implemented in other suitable systems, such as, for example only transformer coupled plasma (TCP) systems, inductively coupled plasma (ICP), CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources 132 supply one or more process gases, inert gases, purge gases, etch gases, precursors and/or other gas mixtures thereof. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements 144, such as thermal control elements (TCEs) arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108.

The temperature controller 142 may communicate with a coolant assembly 146 to control coolant flow through the coolant channels 116. For example, the coolant assembly 146 may include a coolant pump and reservoir. The temperature controller 142 operates the coolant assembly 146 to selectively flow the coolant through the coolant channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

An edge ring 180 surrounds the substrate support 106 during processing. The edge ring 180 is moveable (e.g., moveable upward and downward in a vertical direction) relative to the substrate support 106. For example, the edge ring 180 may be controlled via an actuator and edge ring lift pins (e.g., see FIG. 3) responsive to the controller 160 as described below in more detail. An optical sensor 182 may be used to measure a location of the edge ring 180 relative to an arm/end effector of the robot 170.

A calibrated center location of the edge ring relative to the substrate support can be initially be determined using any suitable method. A suitable example of a calibration process is shown and described in commonly-assigned U.S. Pat. No. 10,541,168 B2, entitled "Edge Ring Centering Method Using Ring Dynamic Alignment Data" and issued on Jan. 21, 2020, which is hereby incorporated by reference in its entirety.

In the calibration process described in U.S. Pat. No. 10,541,168 B2, the edge ring includes a sloped surface and a lower edge ring includes a complementary sloped surface. When sloped surfaces overlap, the edge ring tends to move or slide until seated flat on the substrate surface. When the edge ring moves due to the sloped surfaces, the optical sensor can be used to measure changes in position or offset. Non-zero offset values greater than a predetermined threshold occur when the edge ring is not sufficiently aligned.

The calibration process is an iterative process in that the robot moves the edge ring across the substrate support in four orthogonal directions. An optical sensor measures the position of the edge ring on the end effector of the robot arm before and after each delivery and removal of the edge ring. A controller uses changes in position before and after placement to calculate the offsets and eventually determines a calibrated center location after a significant number of iterations. As can be appreciated, the calibration process typically takes a period that is greater than 12 hours to converge. Furthermore, the calibration process is repeated each time that the edge ring is replaced, which reduces operating time and efficiency.

In some examples, a modified calibration process is used. During the initial calibration process according to the present disclosure, the edge ring is placed on the edge ring lift pins and one or more shims are used to initially center the edge ring relative to one or more surrounding components such as a middle edge ring or bottom edge ring. Then the shims are removed. The end effector of the robot is used to remove the edge ring and a position of the edge ring is determined by an optical sensor. Thereafter, the edge ring is delivered in orthogonal directions around a center location, positions are measured and offsets are calculated. Eventually, a calibrated center location is determined based on the movements and offsets. Thereafter, a much shorter calibration process described below (using a limited number of delivery and removal iterations) can be used. In some examples, the replacement edge rings can be delivered and removed a plurality of times (e.g. 3 to 5 times) and the edge ring can be centered within 30 μm of a calibrated center location in less than 15 minutes (which is substantially less than 12 hours).

Figure 2:
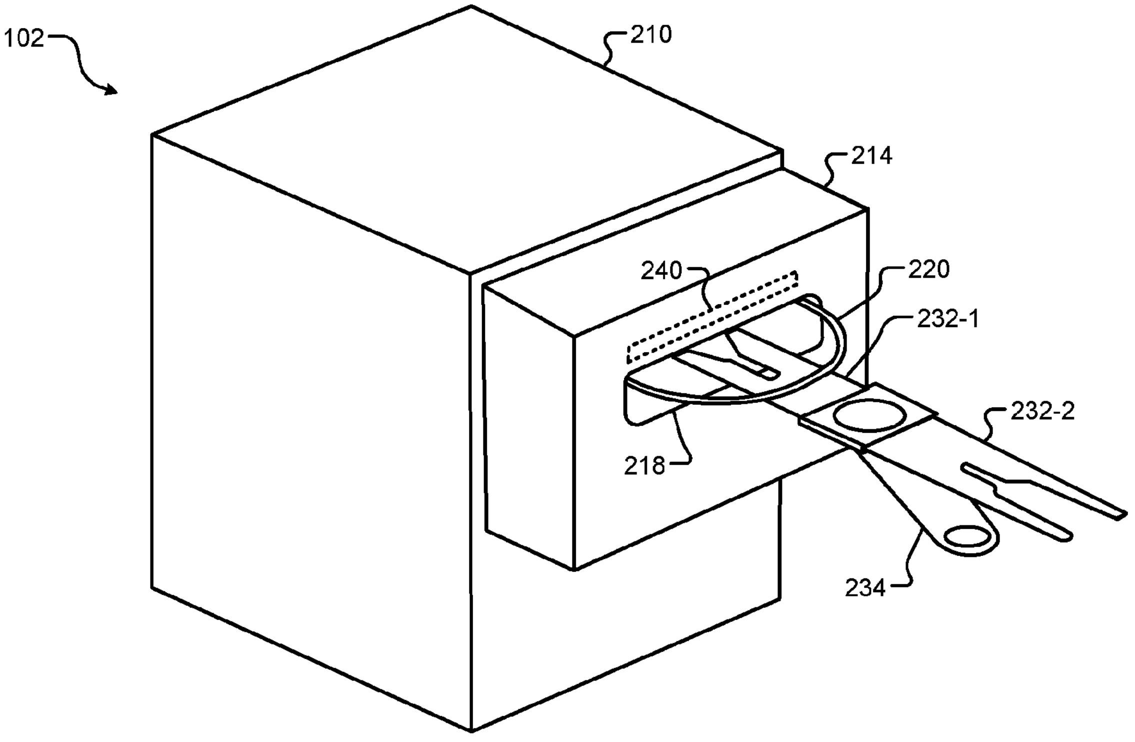
FIG. 2 is a perspective view of an example of a processing chamber, a robot arm including an end effector, and edge ring according to the present disclosure.

Referring now to FIG. 2, the processing chamber 102 includes an enclosure 210 including a top surface, sides and a bottom surface. A chamber port 214 includes a door or opening 218 through which the substrates are delivered and removed. More particularly, a robot arm 234 with an end effector 232 delivers substrates onto the substrate support through the opening 218 before substrate treatment and removes the substrates from the substrate support after substrate treatment. In some examples, the robot arm 234 may form part of a substrate transfer module that operates at vacuum.

The robot arm 234 may also be used to deliver a new edge ring 220 to the processing chamber after removing a worn edge ring 220 from the processing chamber through the chamber port 214. The robot arm 234 includes one or more end effectors 232 (end effectors 232-1 and 232-2 are shown). In FIG. 2, the edge ring 220 is arranged on the end effector 232-1. In some examples, an optical sensor 240 is arranged adjacent to the opening 218 of the chamber port 214 to sense a position of the edge ring on the end effector, although other locations inside or outside of the chamber can be used.

As will be described further below, the robot arm 234 initially places the edge ring 220 on edge ring lift pins (e.g. see FIG. 4) using a calibrated center position and/or a prior center position. The edge ring 220 includes grooves (see FIGS. 3 and 4) that align with the edge ring lift pins. In some examples, the number of grooves is greater than or equal to the number of edge ring lift pins. The edge ring 220 may move from the placement position after the robot arm delivers the edge ring 220 on the edge ring lift pins. In other words, the edge ring 220 may move from the placement position as the edge ring 220 is seated onto the edge ring lift pins.

After the edge ring 220 is seated, the robot arm 234 picks up the edge ring 220 and measures a new position of the edge ring 220 on the robot arm 234 using the optical sensor. The controller calculates the offset (the difference between the prior position of the edge ring and a new position of the edge ring).

The centered location of the edge ring is adjusted based on the offset and the prior center position (to remove the offset). In other words, the center location is adjusted in the opposite direction of the offset to eliminate the offset. Using the new center location (based on the prior center location and the offset), the robot arm 234 places the grooves of the edge ring 220 on the edge ring lift pins. In some examples, the process is repeated Q times, where Q is an integer. In some examples, a relatively small number of iterations can be performed. In some examples, $Q<10$. In other examples, $Q=3$ or $Q=5$.

After the Q iterations, a final offset value is determined and compared to an offset threshold. If the final offset value is less than or equal to the offset threshold corresponding to the center location, then the edge ring is considered to be centered properly and the substrate processing chamber can proceed with substrate treatments.

If the final offset value is greater than the threshold, then the edge ring is not deemed to be centered properly. If the offset is greater than the threshold, the optical sensor may be out of calibration and/or one or more of the grooves on the bottom surface of the edge ring may not be properly in contact with one or more of the corresponding edge ring lift pins.

Figure 3:
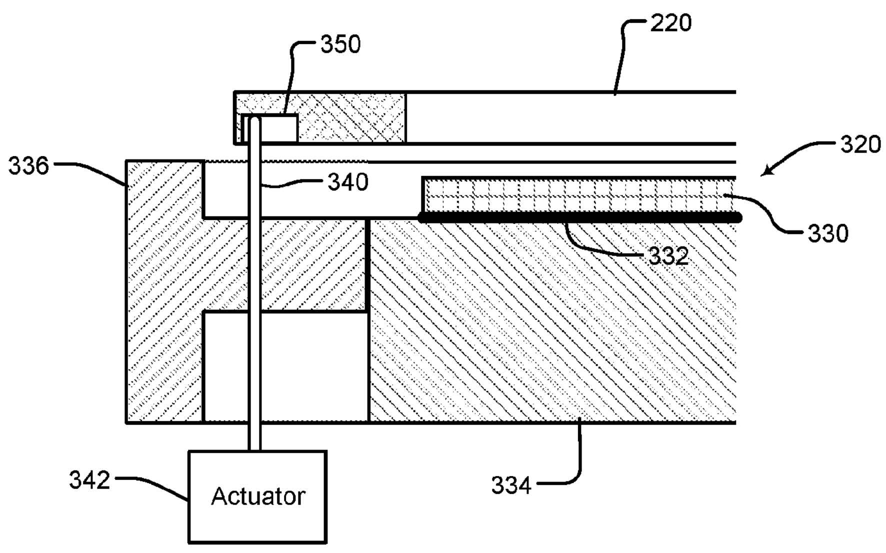
FIG. 3 is a cross-sectional view of an example of a substrate support and an edge ring supported by a lift pin according to the present disclosure.

Referring now to FIG. 3, a substrate support 320 is shown to include a first layer 330, a bonding layer 332, and a baseplate 334. In some examples, the first layer 330 is made of ceramic and includes electrostatic electrodes, RF electrodes, and/or heating elements. A lower edge ring 336 is arranged radially outside of the baseplate 334 and at least partially radially outside of the edge ring 220. The edge ring 220 is arranged on edge ring lift pins 340 that extend into grooves 350 that are located on a bottom surface of the edge ring 220. The edge ring lift pin 340 supports the edge ring 220 and is received by the grooves 350.

Figure 4:
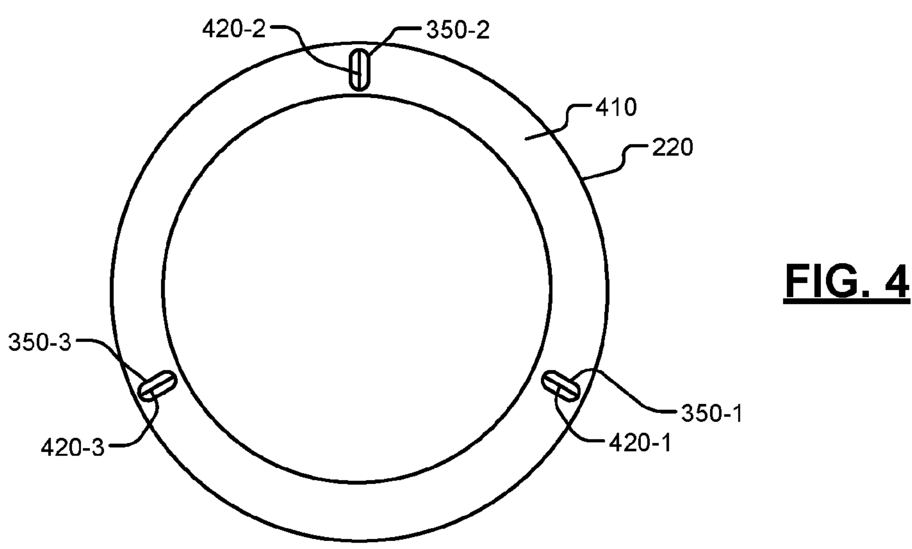
FIG. 4 is a bottom plan view of an example of an edge ring including grooves according to the present disclosure.

Referring now to FIG. 4, the edge ring 220 includes an annular body 410 and a plurality of grooves 350-1. 350-2, . . . , and 350-P (where P is an integer greater than or equal to 3) located on a bottom surface of the edge ring 220. In some examples, the grooves 350 define a cavity having a "V'-shape. In some examples, the edge ring 220 includes P grooves 350 that are azimuthally spaced 360°/P. In some examples, a bottommost portion or slot of the plurality of grooves 350-1. 350-2, . . . , and 350-P extends generally parallel to an upper surface of the substrate support when the annular body of edge ring lies parallel to the upper surface of the substrate support. The bottommost portions of the plurality of grooves 350-1. 350-2, . . . , and 350-P extend in radial directions relative to a center of the edge ring.

Figure 5:
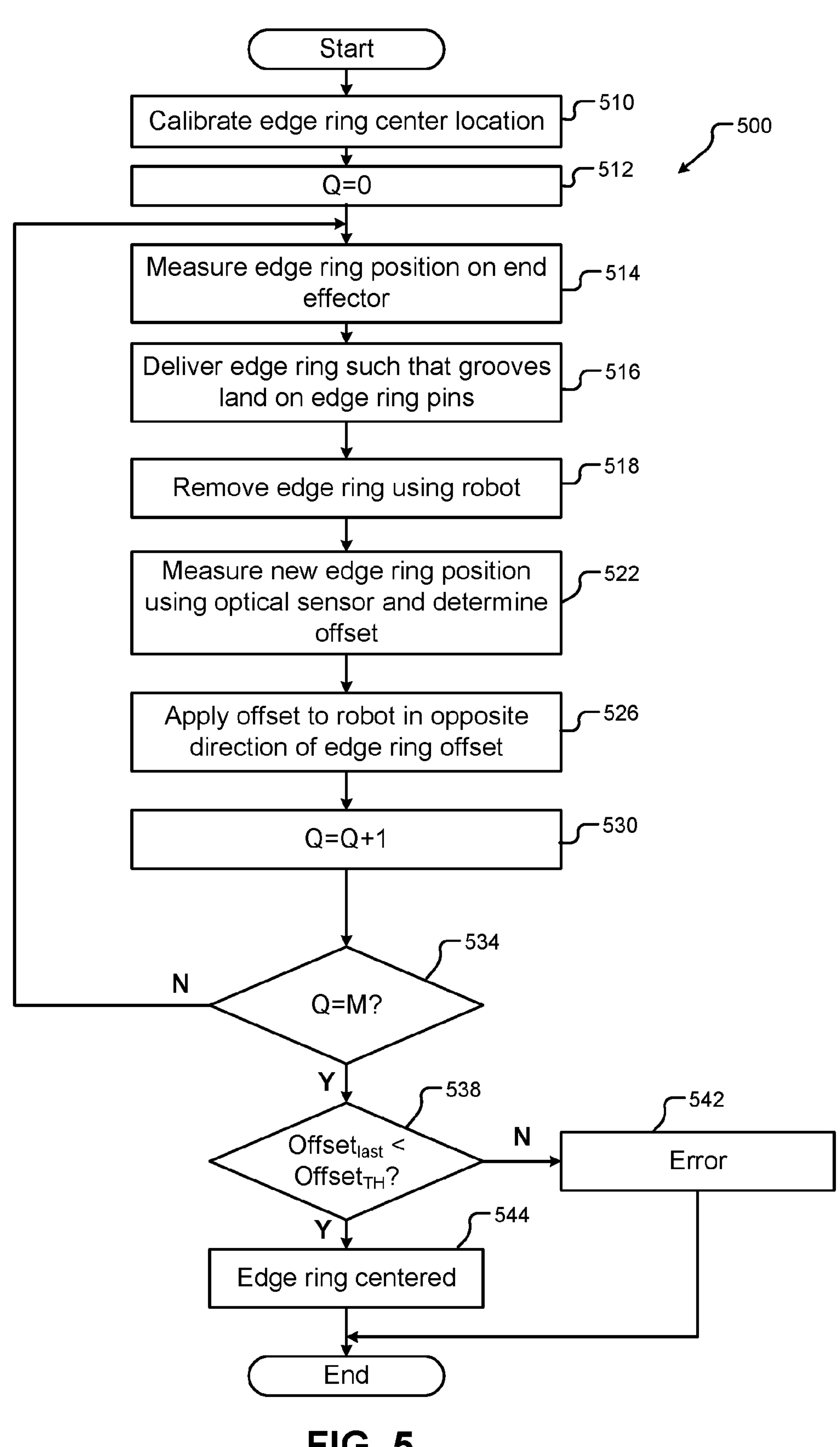
FIG. 5 is a flowchart of an example of a method for centering an edge ring according to the present disclosure.

Referring now to FIG. 5, a method 500 for centering an edge ring is shown. At 510, an edge ring center location is calibrated. In some examples, the calibration method described above is used, although other types of calibration can be used. At 512, Q is set equal to zero. At 514, the edge ring position is measured on the end effector of the robot. The edge ring is placed onto the edge ring lift pins (with the edge ring lift pins in the grooves) using the end effector of the robot arm at 516. The robot arm releases the edge ring and the edge ring is allowed to seat itself on the edge ring lift pins.

At 518, the edge ring is removed using the robot. At 522, the position of the edge ring is determined using the optical sensor and the offset from the calibrated edge ring center location or a prior edge ring center location is calculated. At 526, the offset is applied to the center location. In other words, the robot arm is moved in a direction opposite to the offset to adjust the center location and to eliminate the offset. At 530, Q is set equal to Q+1.

At 534, the method determines whether Q=M, where Q and M are integers. In some examples, M is greater than or equal to 2 (e.g. 3, 5, etc.). If 534 is false, the method returns to 514 and repeats. If 534 is true, the method continues at 538 and determines whether the last offset value ($Offset_{last}$) is less than or equal to an offset threshold ($Offset_{TH}$). If 538 is true, the edge ring is considered to be centered at 544 since the offset is within the predetermined threshold. If 538 is false, an error occurs at 542 and the edge ring is not considered to be centered since the offset is greater than the predetermined threshold. In some examples, the substrate processing system may be disabled to allow further diagnosis of the edge ring centering problem.

As can be appreciated, the edge ring centering system described herein is able to repeatedly place the edge ring on the edge ring lift pins with high accuracy within a relatively short period. In some examples, the edge ring centering system is able to place the edge ring within 30 μm (and 15 μm 3 sigma) in 15 minutes per chamber per substrate transfer module arm.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor substrate or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor substrates.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of substrates to and from tool locations and/or load ports in a semiconductor manufacturing factory.

What is claimed is:

1. An edge ring centering system for a plasma processing system, comprising:
- a processing chamber including a substrate support and R edge ring lift pins, where R is an integer greater than or equal to 3;
- a first edge ring including P grooves located on a bottom surface thereof, where P is an integer greater than or equal to R;
- a robot arm including an end effector;
- an optical sensor; and
- a controller configured to perform an initial calibration to determine a calibrated center location for the first edge ring, wherein the controller is configured, subsequent to performing the initial calibration, to perform M iterations of a centering process, where M is an integer greater than or equal to 2, each of the M iterations including:
  - causing the optical sensor to sense a first position of the first edge ring on the end effector;
  - causing the robot arm to deliver the first edge ring to at least one of the calibrated center location and a last adjusted center location on the R edge ring lift pins;
  - retrieving the first edge ring from the R edge ring lift pins;
  - causing the optical sensor to sense a second position of the first edge ring on the end effector;
  - determining an offset based on the first position and the second position; and
  - based on the at least one of the calibrated center location and the last adjusted center location, applying the offset to the robot arm in an opposite direction of the offset to adjust a current location of the first edge ring to an adjusted center location.

2. The edge ring centering system of claim 1, wherein the controller is configured to generate the adjusted center location for the first edge ring based on the calibrated center location and the offset.

3. The edge ring centering system of claim 2, wherein the controller is further configured to;
- cause the robot arm to deliver the first edge ring onto the R edge ring lift pins based on the adjusted center location;
- retrieve the first edge ring from the R edge ring lift pins; and
- cause the optical sensor to sense the second position of the first edge ring on the robot arm.

4. The edge ring centering system of claim 3, wherein the controller is configured to update the offset based on a difference between the first position and the second position during one of the iterations of the centering process.

5. The edge ring centering system of claim 4, wherein the controller is configured to generate the adjusted center location during the one of the iterations of the centering process based on the adjusted center location determined during a previous iteration of the centering process and the updated offset.

6. The edge ring centering system of claim 1, wherein the controller is configured to compare the offset to a predetermined offset subsequent to performing the M iterations of the centering process, and determine whether the first edge ring is centered based on the comparison.

7. The edge ring centering system of claim 1, wherein the P grooves are "V"-shaped.

8. The edge ring centering system of claim 1, wherein the P grooves are spaced 360°/P around the bottom surface of the first edge ring.

9. The edge ring centering system of claim 1, wherein the P grooves are "V"-shaped and wherein a bottommost portion of the P grooves extend in a radial direction.

10. The edge ring centering system of claim 1, wherein the controller causes the robot arm, in a first iteration of the M iterations, to deliver the first edge ring to the calibrated center location and, in subsequent iterations of the M iterations, to deliver the first edge ring to the last adjusted center location.

11. The edge ring centering system of claim 1, wherein the controller is configured for the first iteration of the M iterations to generate the adjusted center location for the first edge ring based on the calibrated center location and the offset.

12. The edge ring centering system of claim 11, wherein the controller is configured to update the offset based on a difference between the first position and the second position during one of the iterations of the centering process.

13. The edge ring centering system of claim 12, wherein the controller is configured for subsequent iterations of the M iterations to generate the adjusted center location based on the last adjusted center location determined during a previous iteration of the centering process and the updated offset.

14. The edge ring centering system of claim 1, wherein the controller is further configured to compare the offset to a predetermined offset subsequent to performing the M iterations of the centering process.

15. The edge ring centering system of claim 1, wherein the controller is configured to:
- determine whether the offset for the $M^{th}$ iteration of the M iterations is less than a predetermined threshold;
- in response to the offset for the $M^{th}$ iteration being less than the predetermined threshold, determining that the first edge ring is centered; and
- in response to the offset for the $M^{th}$ iteration being greater than or equal to the predetermined threshold, determining that an error exists with centering the first edge ring.

16. The edge ring centering system of claim 1, wherein the controller is configured to perform the centering process for a replacement edge ring based on the calibrated center location of the first edge ring.

17. The edge ring centering system of claim 1, wherein the controller is configured to:

refrains from picking up the first edge ring until the first edge ring is seated on the R edge ring lift pins; and subsequent to the first edge ring being seated on the R edge ring lift pins, causes the robot arm to retrieve the first edge ring from the R edge ring lift pins.

18. The edge ring centering system of claim 1, wherein the calibrated center location refers to a center location of the first edge ring on the R edge ring lift pins and relative to the substrate support determined during the initial calibration using shims to center the first edge ring.

19. The edge ring centering system of claim 1, wherein the offset of the first edge ring is due to a change in position of the first edge ring due to removal or replacement of the first edge ring via the end effector and relative to the R edge ring lift pins.

* * * * *